(12) United States Patent
Cheng et al.

(10) Patent No.: US 8,387,250 B2
(45) Date of Patent: *Mar. 5, 2013

(54) METHOD FOR EMBEDDING HEAT PIPE INTO HEAT-CONDUCTING SEAT

(75) Inventors: Chih-Hung Cheng, Wugu Township, Taipei County (TW); Kuo-Len Lin, Wugu Township, Taipei County (TW); Ken Hsu, Wugu Township, Taipei County (TW)

(73) Assignees: Cpumate Inc., New Taipei (TW); Golden Sun News Techniques Co., Ltd., New Taipei (TW)

(*) Notice: Subject to any disclaimer, the term of this patent is extended or adjusted under 35 U.S.C. 154(b) by 940 days.

This patent is subject to a terminal disclaimer.

(21) Appl. No.: 12/264,651

(22) Filed: Nov. 4, 2008

(65) Prior Publication Data
US 2009/0049691 A1 Feb. 26, 2009

Related U.S. Application Data

(63) Continuation-in-part of application No. 11/383,192, filed on May 12, 2006, now abandoned.

(51) Int. Cl.
*B23P 6/00* (2006.01)
*B23P 15/26* (2006.01)

(52) U.S. Cl. .... 29/890.032; 29/726; 29/727; 72/370.04; 72/370.23

(58) Field of Classification Search ............... 29/890.32, 29/726, 727, 784, 282; 72/405.01, 405.16, 72/405.07, 367.1, 370.04, 370.23, 370.26
See application file for complete search history.

(56) References Cited

U.S. PATENT DOCUMENTS

| | | | | |
|---|---|---|---|---|
| 1,891,785 A * | 12/1932 | Siebert et al. | ............ | 72/370.23 |
| 2,532,303 A * | 12/1950 | Hayward | ............ | 29/727 |
| 3,345,726 A * | 10/1967 | Hickman et al. | ............ | 29/890.047 |
| 3,498,369 A * | 3/1970 | Levedahl | ............ | 165/104.26 |
| 4,065,637 A * | 12/1977 | Allison | ............ | 174/87 |
| 4,209,898 A * | 7/1980 | Aoki et al. | ............ | 29/783 |
| 4,274,800 A * | 6/1981 | Tsuruha | ............ | 198/448 |
| 4,346,582 A * | 8/1982 | Bailey | ............ | 72/379.6 |
| 4,353,415 A * | 10/1982 | Klaschka et al. | ............ | 165/104.21 |
| 4,562,719 A * | 1/1986 | Budrean et al. | ............ | 72/349 |
| 4,569,256 A * | 2/1986 | Pepper | ............ | 76/107.8 |
| 5,586,387 A * | 12/1996 | Nakatani et al. | ............ | 29/703 |
| 5,743,122 A * | 4/1998 | Rhodes et al. | ............ | 72/51 |
| 5,901,443 A * | 5/1999 | Rhodes et al. | ............ | 29/890.044 |
| 6,256,868 B1* | 7/2001 | Sugito et al. | ............ | 29/711 |
| 6,519,837 B1* | 2/2003 | Ichikawa et al. | ............ | 29/720 |
| 6,530,255 B1* | 3/2003 | Usui et al. | ............ | 72/334 |
| 6,918,429 B2* | 7/2005 | Lin et al. | ............ | 165/80.3 |
| 7,021,368 B2* | 4/2006 | Lin et al. | ............ | 165/104.33 |
| 7,093,648 B1* | 8/2006 | Cheng | ............ | 165/104.33 |
| 7,245,494 B2* | 7/2007 | Cheng | ............ | 361/700 |
| 7,455,102 B2* | 11/2008 | Cheng | ............ | 165/104.33 |
| 7,698,815 B2* | 4/2010 | Garner | ............ | 29/890.04 |
| 8,161,644 B2* | 4/2012 | Lin et al. | ............ | 29/890.032 |
| 2004/0201963 A1* | 10/2004 | Garner | ............ | 361/700 |

* cited by examiner

*Primary Examiner* — David Bryant
*Assistant Examiner* — Jason L Vaughan
(74) *Attorney, Agent, or Firm* — Chun-Ming Shih; HDLS IPR Services

(57) ABSTRACT

A method for embedding a heat pipe into a slot of heat-conducting seat is disclosed. The method has the exposed portion of the heat pipe be flat and coplanar with the surface of the heat-conducting seat after the heat pipe is embedded into the slot of the seat. The method utilizes a power press machine with multiple stamping dies to progressively press the heat pipe.

4 Claims, 14 Drawing Sheets

US 8,387,250 B2

METHOD FOR EMBEDDING HEAT PIPE INTO HEAT-CONDUCTING SEAT

This application is a continuation-in-part of U.S. patent application Ser. No. 11/383,192, filed May 12, 2006 now abandoned.

FIELD OF THE INVENTION

The present invention relates to manufacture of heat dissipation devices, and more specifically, to manufacture of embedding a heat pipe into a seat.

BACKGROUND OF THE INVENTION

FIG. 1 shows a U-shaped heat pipe pressed. The heat pipe 1a has an evaporation section 10a. The bottom of the evaporation section 10a must be pressed to form a flat heated surface 100a for directly and planarly touching a heat source. During the pressing process, the stamping die must have a flat plane. When a plane of the stamping die initially meets a curved surface of the heat pipe 1a, the touch portion will be linear and then become planar. However, the initially linear touch tends to invite a problem of stress concentration. Therefore, a recess 101a often forms on the heated surface 100a of the heat pipe 1a. When once the recess 101a appears, an additional grinding procedure after pressing will be necessary for effacing the recess 101a.

This problem can be solved by adopting a multi-stroke progressive pressing procedure. This procedure can progressively press the pipe to be flat, but it must use various stamping dies with different recessing depth or shapes. Meanwhile, only one stamping die can be used to press the pipe at some time. Thus, during the pressing process those stamping dies must be changed one by one in order to ensure the flatness of the pipe being pressed. It is very inconvenient and uneconomical for the manufactures.

SUMMARY OF THE INVENTION

An object of the present invention is to provide a new and improved method, which can embed a heat pipe into a slot of a seat and form a flat plane on the heat pipe at the same time without changing stamping dies.

To accomplish the object abovementioned, one preferred embodiment of the invention includes the steps of:

a) preparing a heat pipe and a heat-conducting seat having a slot;

b) disposing the heat pipe in the slot;

c) arranging the heat pipe with the heat-conducting seat on a power press machine, wherein the power press machine has:

a bolster bed for being placed by the heat pipe with the heat-conducting seat; and a ram over the bolster bed, having a plurality of stamping dies, each of the stamping dies having a pressing surface, wherein one of the pressing surfaces is a flat plane, and each of the others has a recess sequentially with different depth; and d) pressing the heat pipe deposed in the slot sequentially with each of the stamping dies.

BRIEF DESCRIPTION OF THE DRAWINGS

The object, features and advantages of the invention will become readily apparent to those skilled in the art upon reading the description of the exemplary embodiment, in conjunction with the attached drawings, in which.

DETAILED DESCRIPTION OF THE INVENTION

Figure 1:
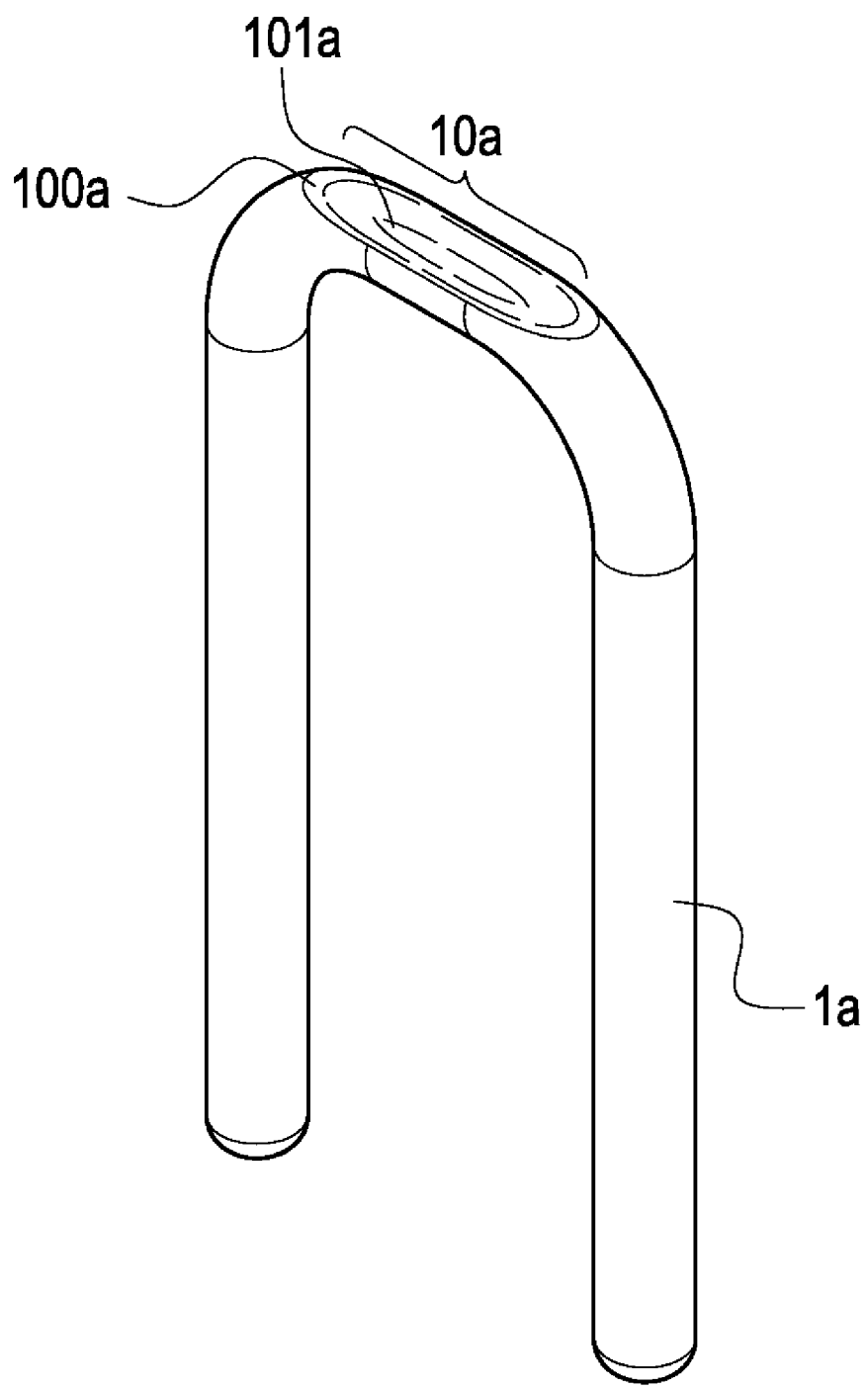
FIG. 1 shows a heat pipe with a plane pressed by conventional method.
Figure 2:
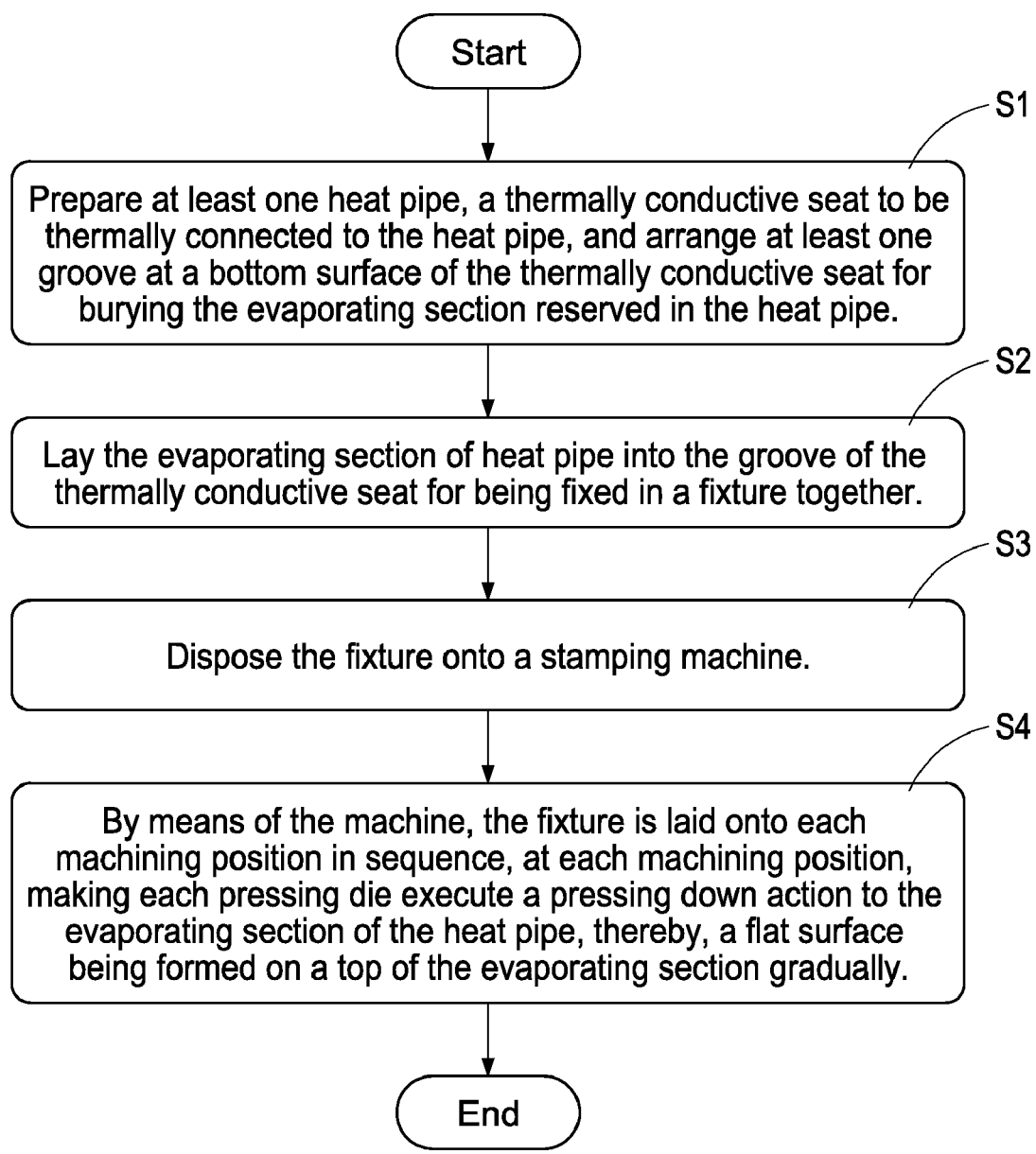
FIG. 2 is a flowchart of the method according to the present invention.

Referring to FIG. 2, which shows a flowchart of the invention, the present invention provides a method for embedding a heat pipe into a heat-conducting seat.

Figure 3:
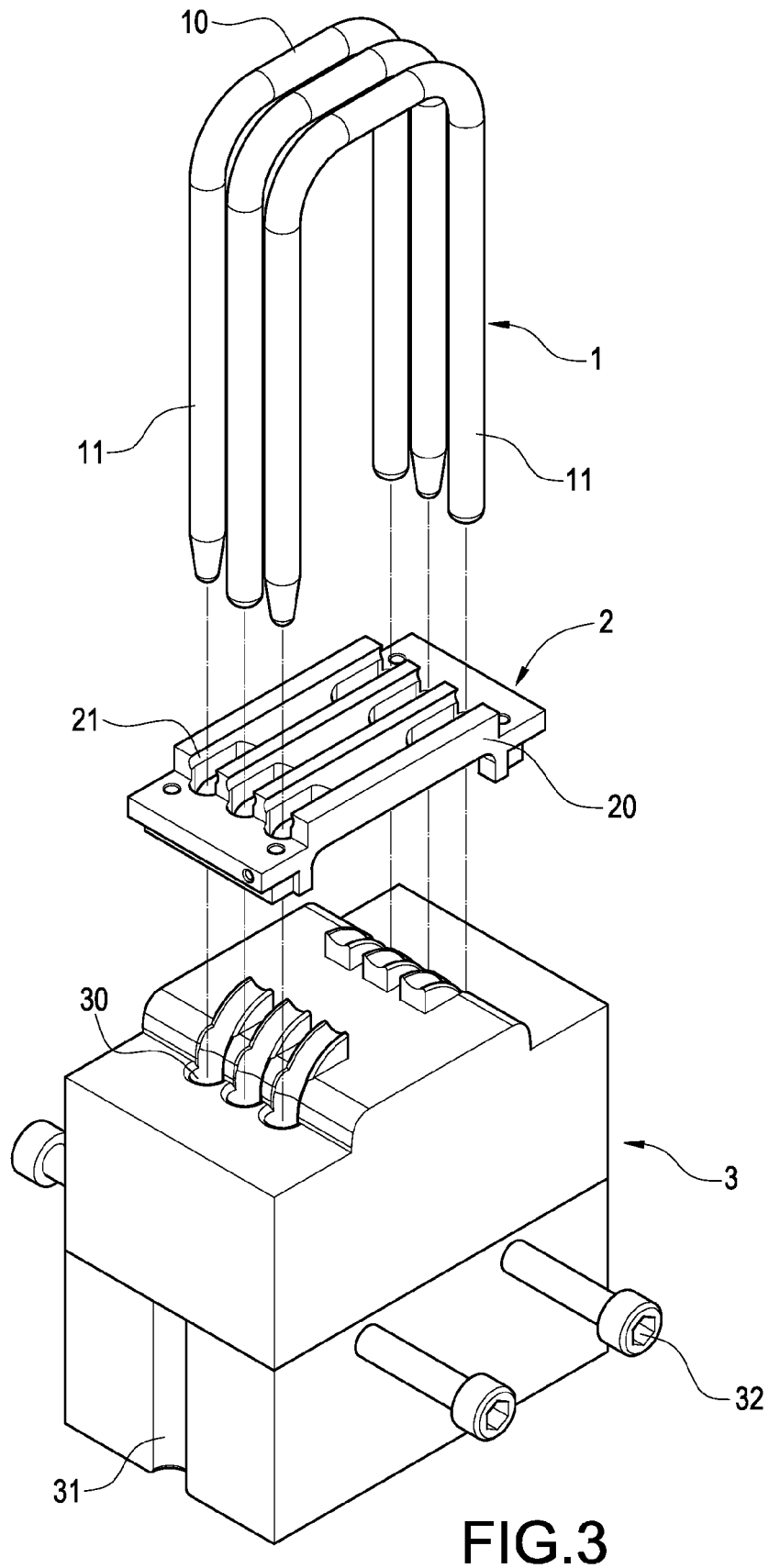
FIG. 3 is an exploded view of the heat pipes, heat-conducting seat and holder.

Referring to FIGS. 2 and 3, step S1 of the method provides at least one heat pipe 1 and a heat-conducting seat 2 for coupling with the heat pipe 1. FIG. 2 shows an embodiment in which there are 3 heat pipes 1, but those skilled in the art must know the number of the heat pipes 1 can vary for practical requirements. The bottom 20 of the heat-conducting seat 2 has slots 21 for accommodating an evaporation section 10 of the heat pipes 1.

Figure 4:
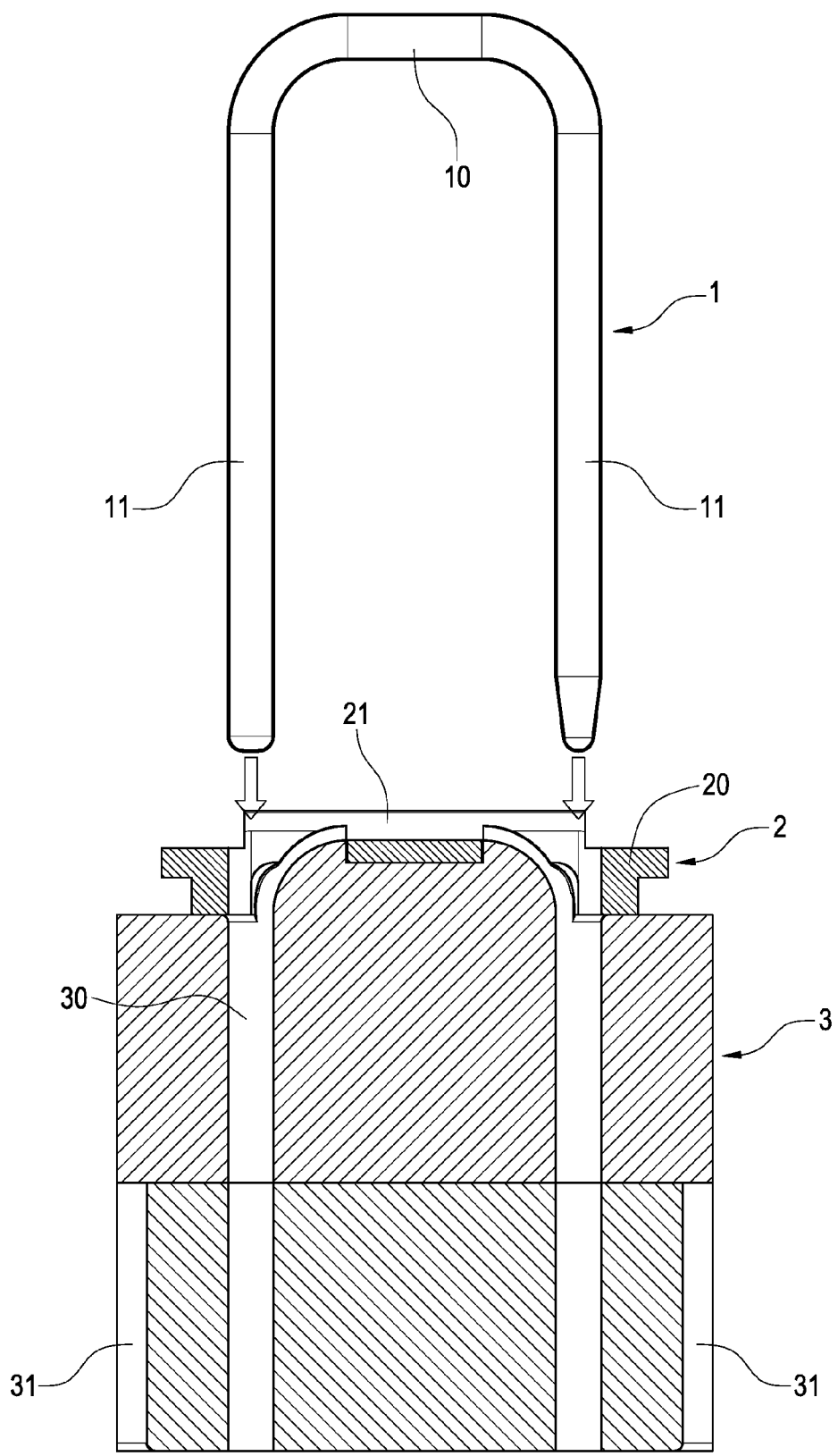
FIGS. 4 and 5 illustrate how the heat pipe passes through the heat-conducting seat and the holder.
Figure 5:
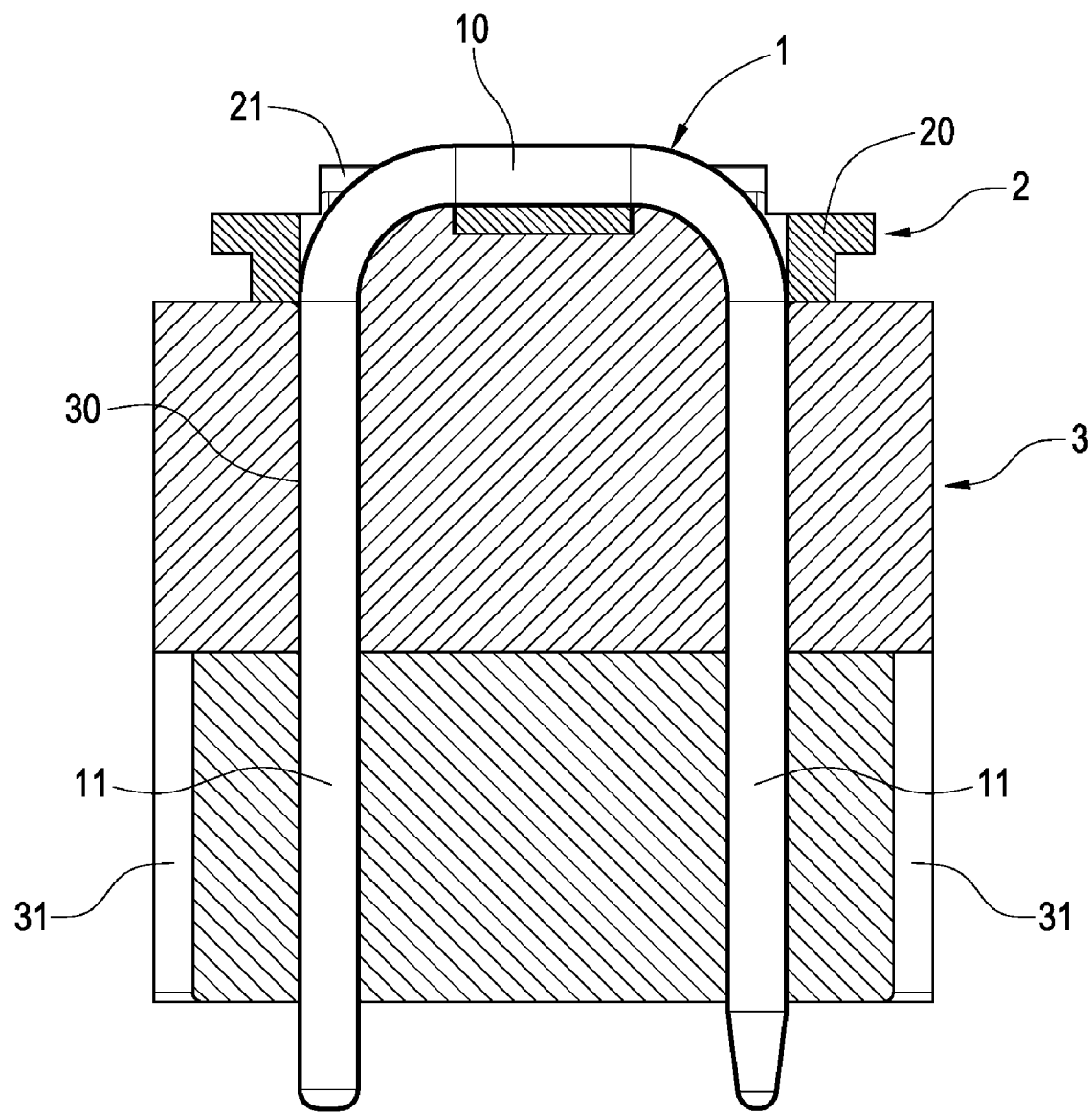
Figure 6:
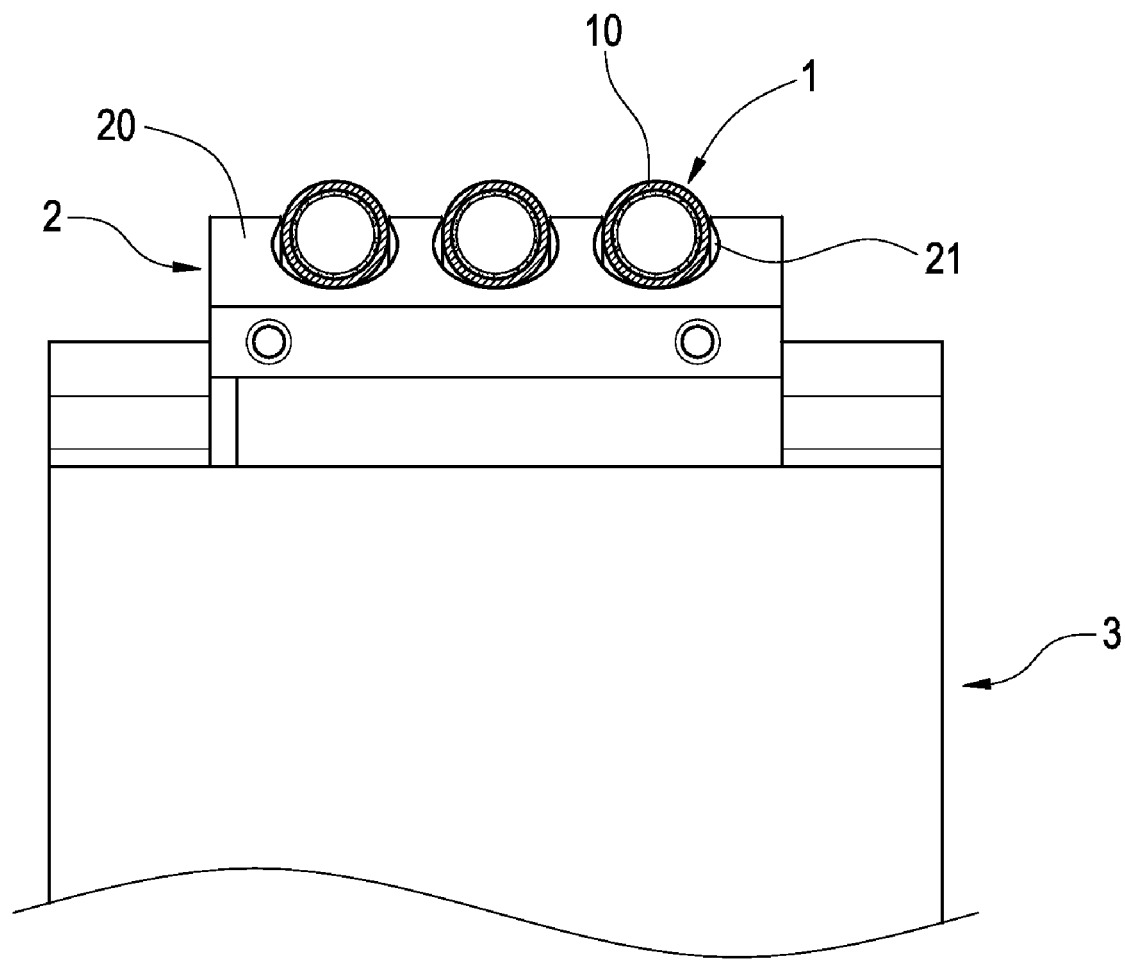
FIG. 6 is a partially sectional view showing the heat pipe in the slot.

Step S2 of the method disposes the evaporation section 10 of the heat pipes 1 in the slots 21 of the heat-conducting seat 2. Both the heat pipes 1 and the heat-conducting seat 2 are fixed on a holder 3. As shown in FIGS. 4 and 5, the holder 3 may have a through hole 30 for accommodating the condensation section 11 of the heat pipes 1. Further referring to FIG. 6, the slot 21 is of a C shape. A part of the heat pipe 1 is higher than the bottom 20 of the heat-conducting seat 2 and protrudes from the slot 21 when the heat pipe 1 is accommodated in the slot 21. The protrusive portion of the heat pipe 1 is just the portion which will be pressed in later steps. Additionally, as shown in FIG. 3, the holder 3 may preferably has one or more handles 32 for conveniently being held by a user.

Figure 7:
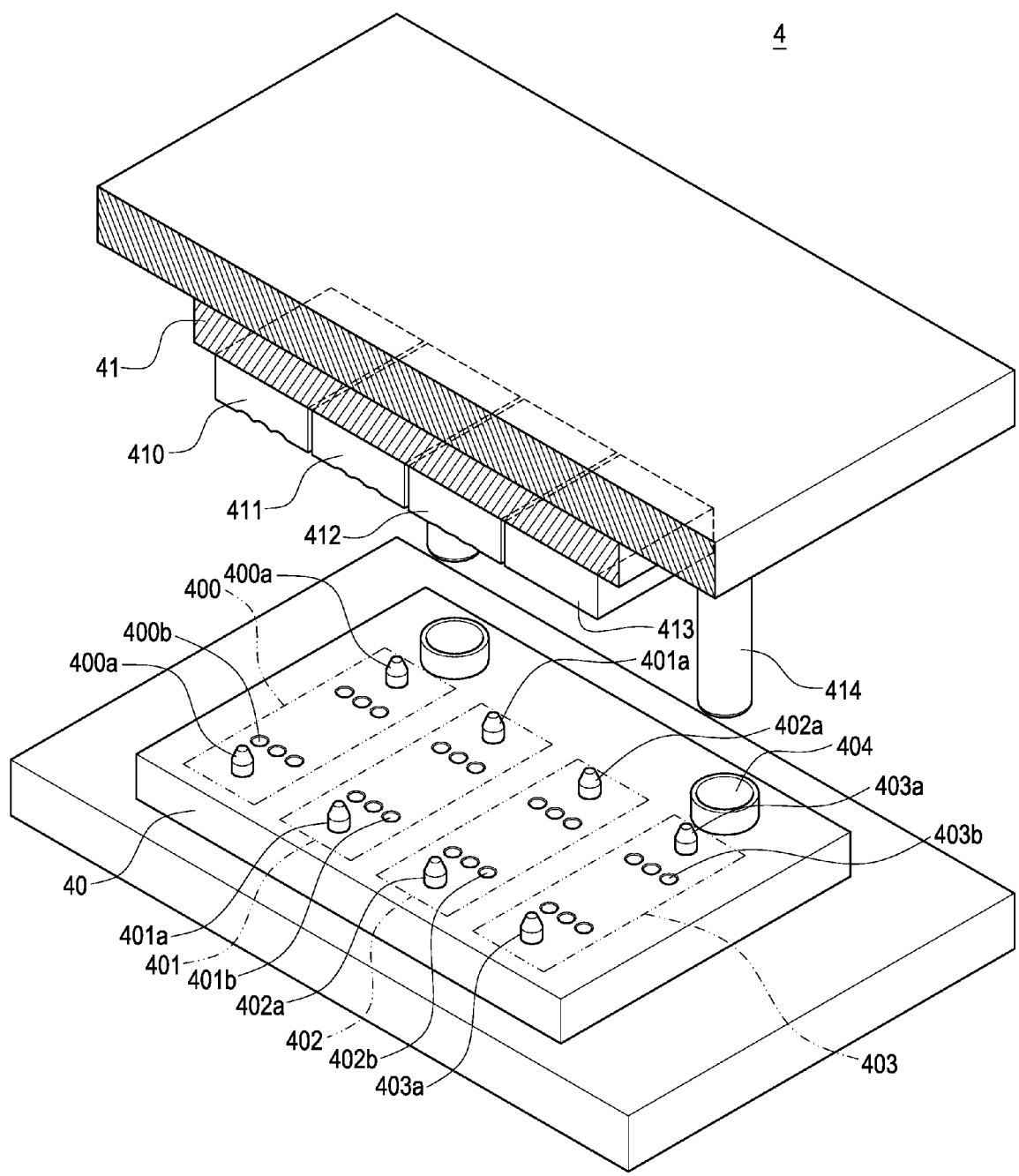
FIG. 7 illustrates a perspective view of the power press machine.
Figure 8:
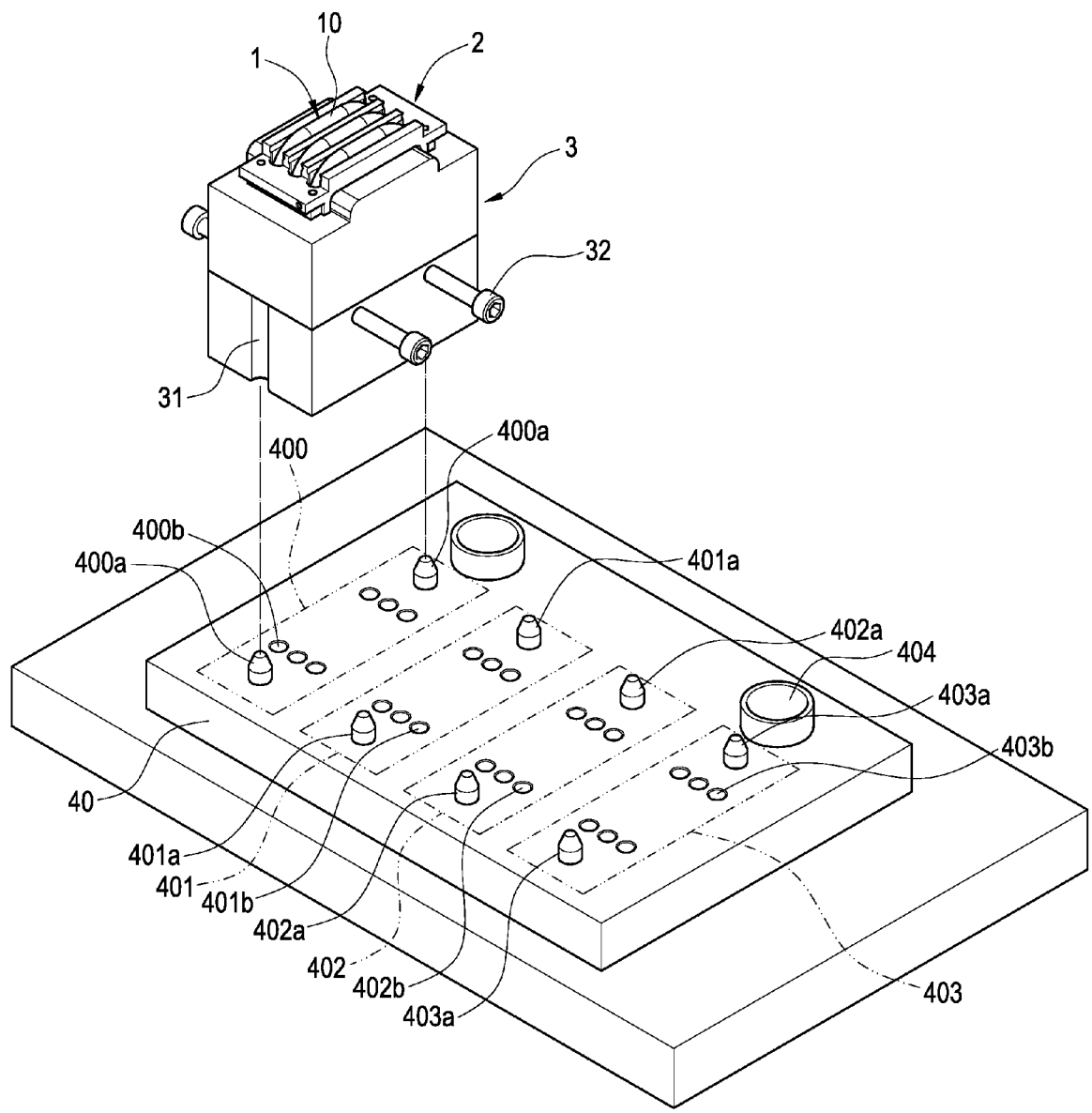
FIG. 8 shows how the holder is mounted on the working area of the bolster bed.

Referring to FIGS. 2 and 7, step S3 of the invention arranges the holder 3 on a power press machine 4. The holder 3 includes a bolster bed 40 and a ram 41 over it. There are a plurality of working areas for positioning the holder 3 on the bolster bed 40. In a preferred embodiment as shown in FIG. 7, there are a first working area 400, a second working area 401, a third working area 402 and a fourth working area 403. These working areas 400-403 are arranged in a row. Each of the working areas 400-403 has two positioning bars 400a-403a responding to grooves 31 on the holder 3 as shown in FIG. 8, so that the holder 3 can be precisely mounted on each working area 400-403 of the bolster bed 40. Moreover, one or more receiving holes 400b, 401b, 402b and 403b, which can accommodate excessive portion of the heat pipe 1, are disposed on each working area 400-403. The holder 3 is not a necessary element. The heat pipe 1 and heat-conducting seat 2 may also be directly mounted on the bolster bed 40 if there is a particular arrangement between them.

Figure 9:
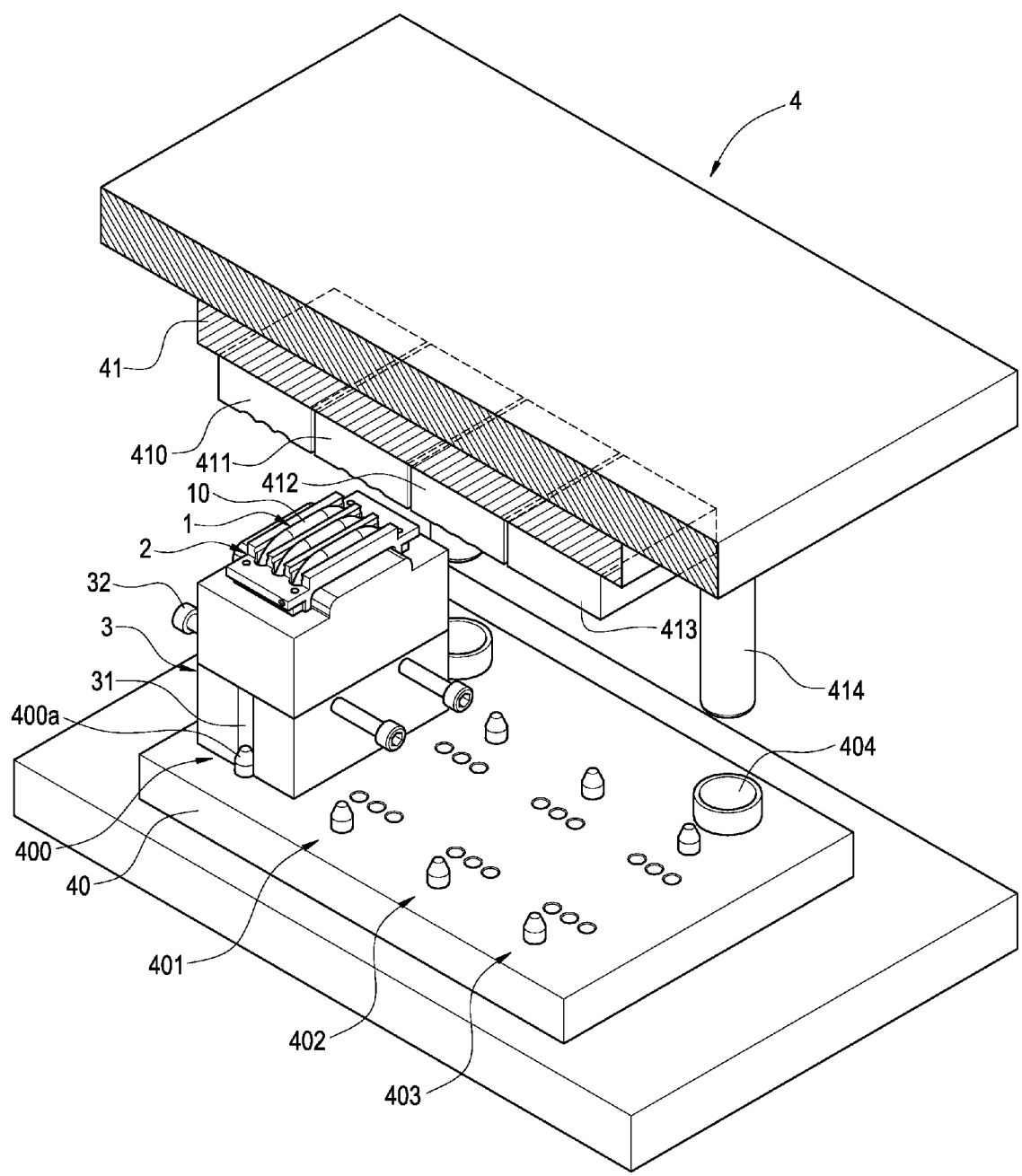
FIG. 9 shows the holder with the heat pipe and heat-conducting seat, which is mounted on the power press machine.

The ram 41 of the power press machine 4 is used for downward pressing a material on the bolster bed 40. There are a plurality of stamping dies 410-413 under the ram 41. In a preferred embodiment as shown in FIG. 9, the number of the stamping dies 410-413 is four, i.e. first, second, third and fourth stamping die. Those stamping dies 410-413 are corresponding to the working areas 400-403, respectively.

Figure 10A:
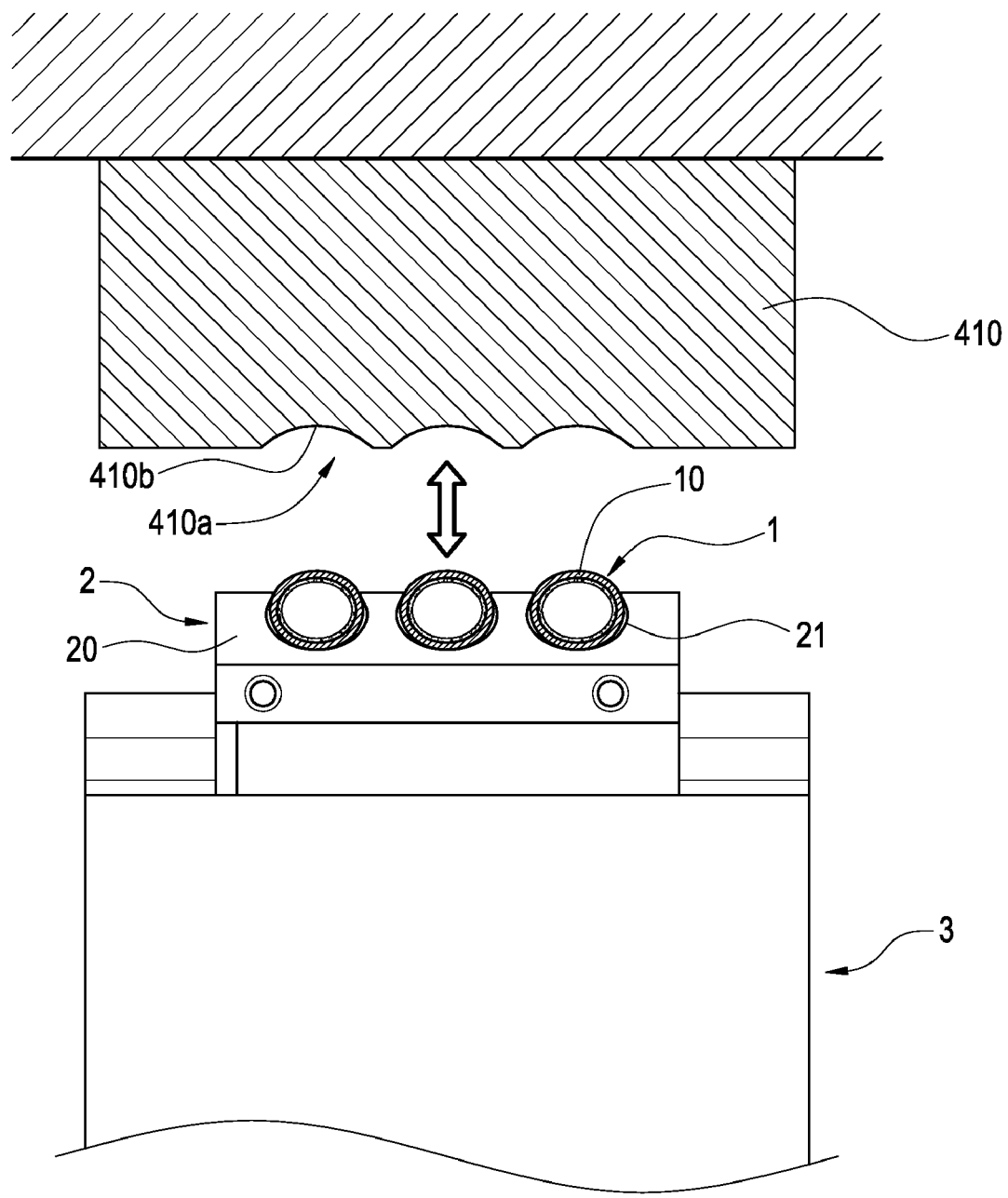
FIGS. 10A-D sequentially illustrate the progressive status for the heat pipe pressed by different stamping dies.
Figure 10B:
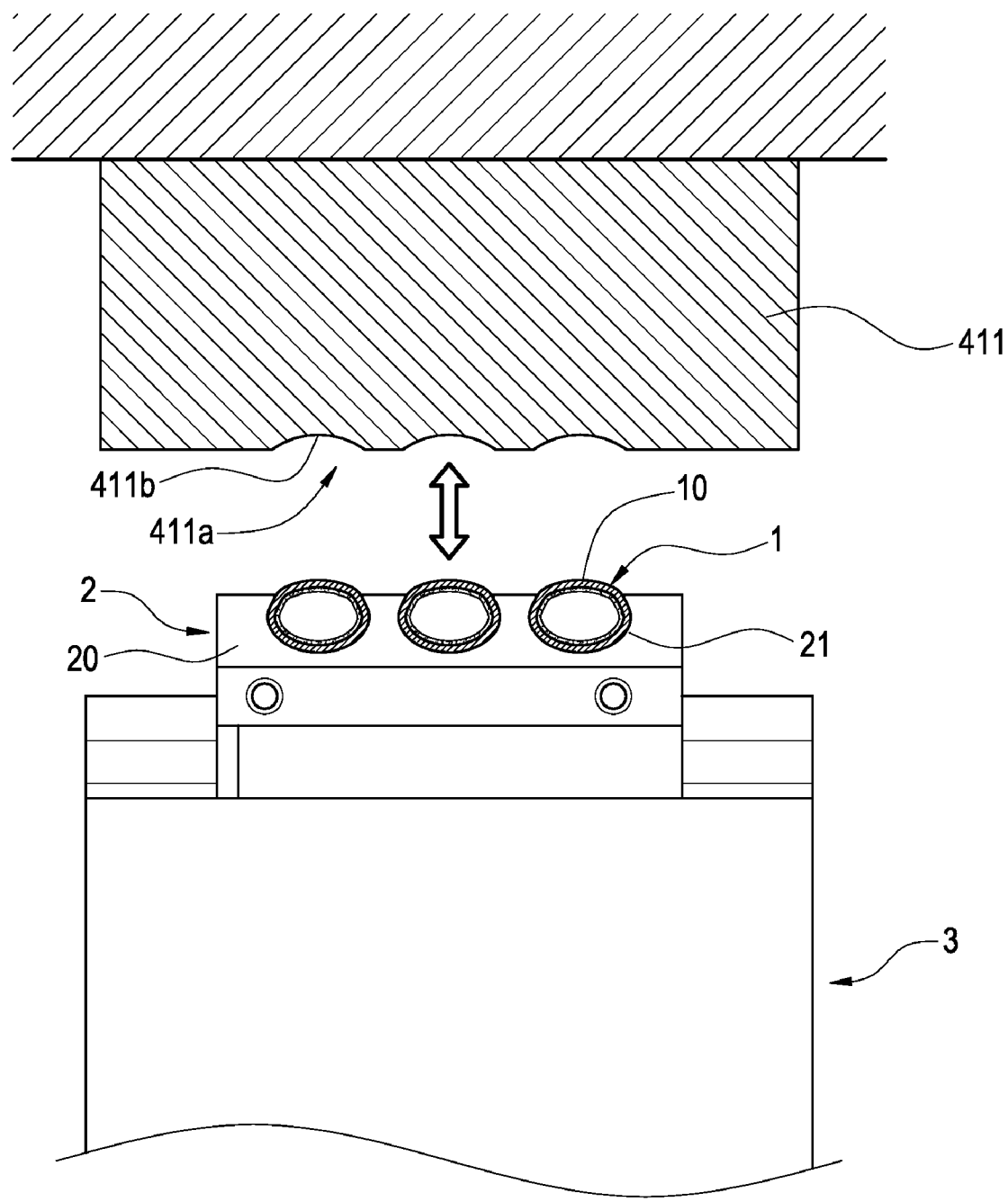
Figure 10C:
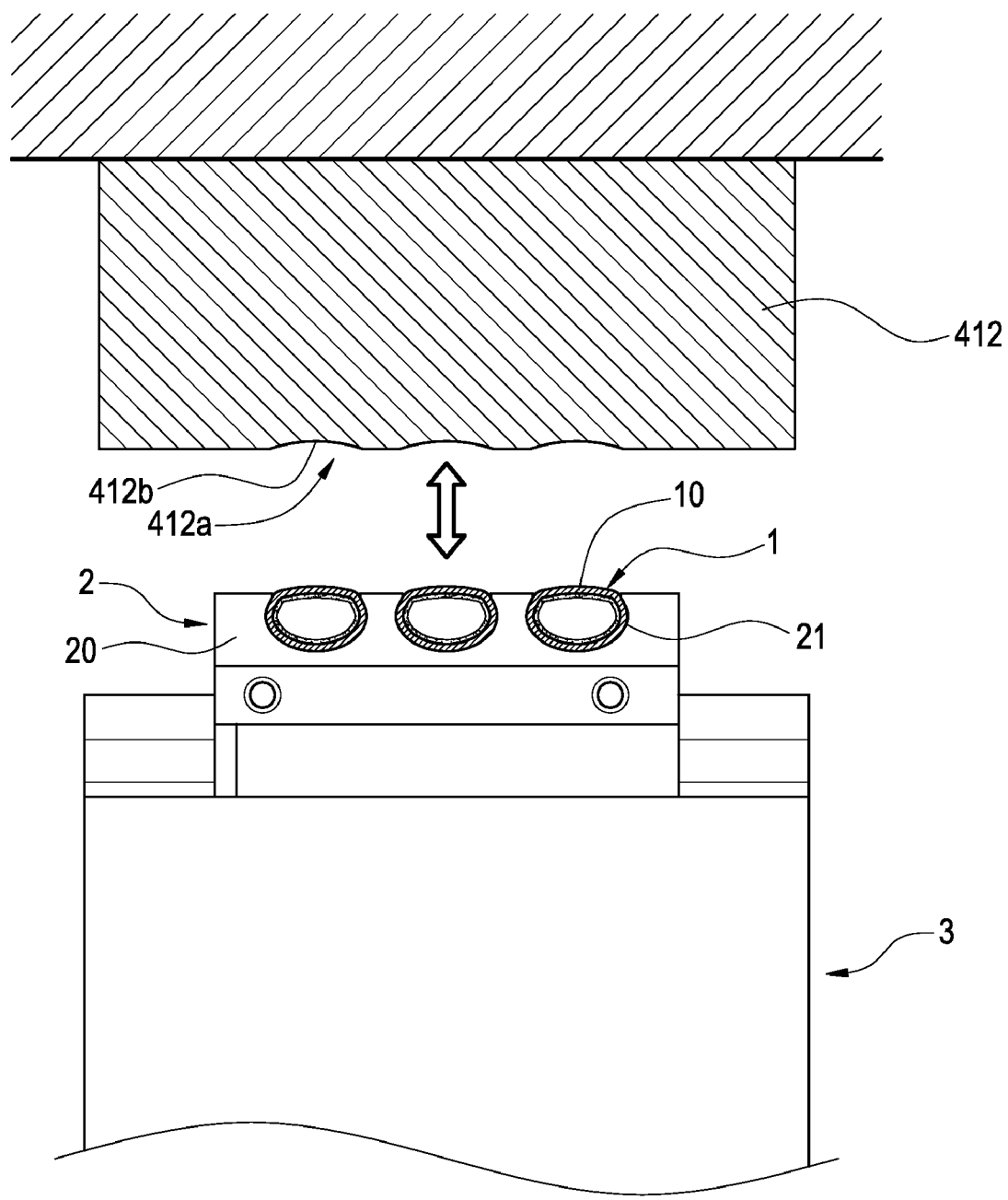
Figure 10D:
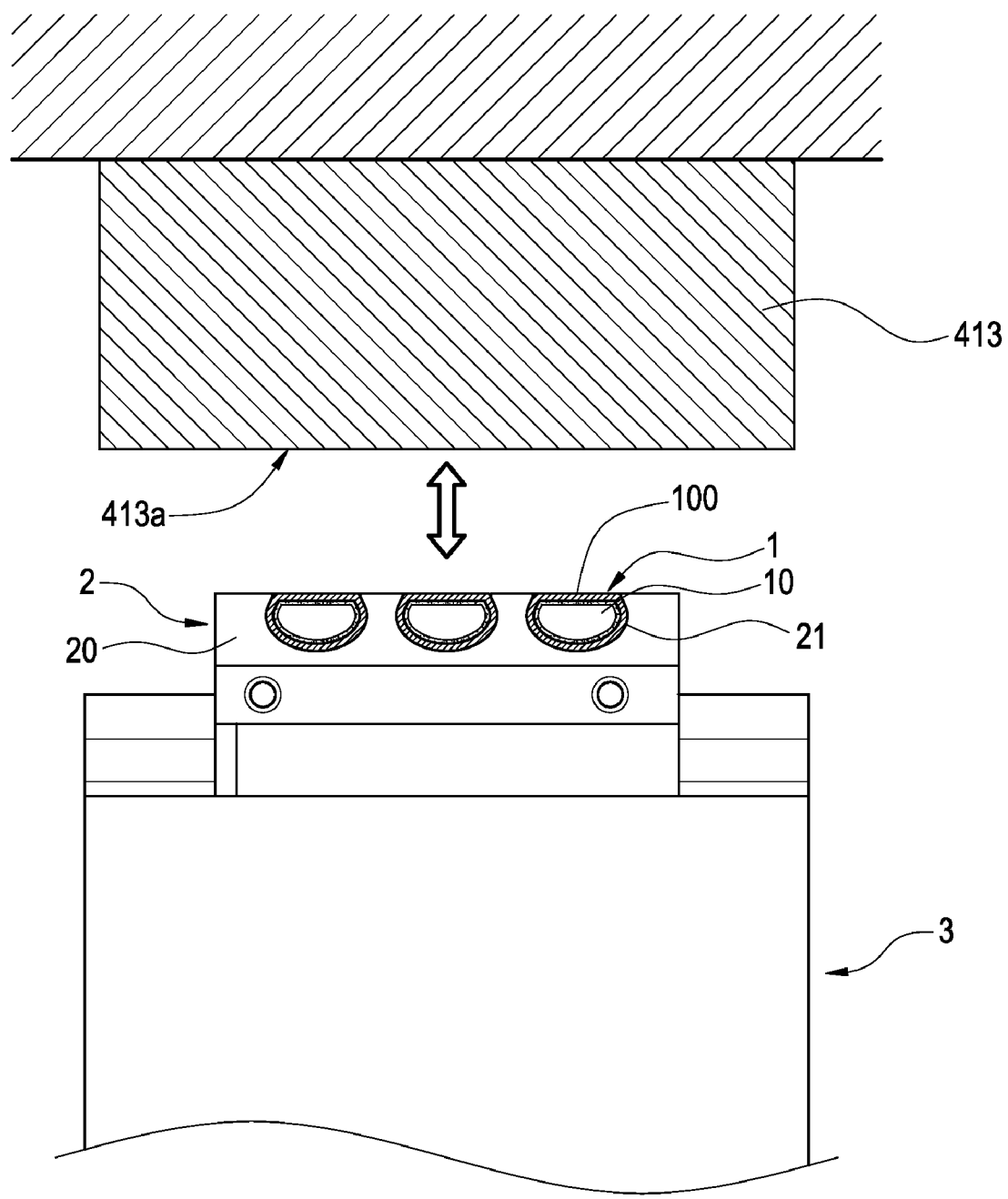

FIGS. 10A-10D shows the differences among the stamping dies 410-413. Each of the stamping dies 410-413 has a pressing surface 410a-413a, wherein the fourth pressing surface 413a is a flat plane as shown in FIG. 10D, and the first, second and third pressing surfaces 410-412 separately have a recess 410b-412b with different depth from deep to flat. Additionally, a plurality of guiding rods 414 downward extend from the ram 41. The guiding rods 414 are corresponding to guiding holes 404 on the bolster bed 40 for providing necessary pressing depth of the guiding rods 414.

Figure 11:
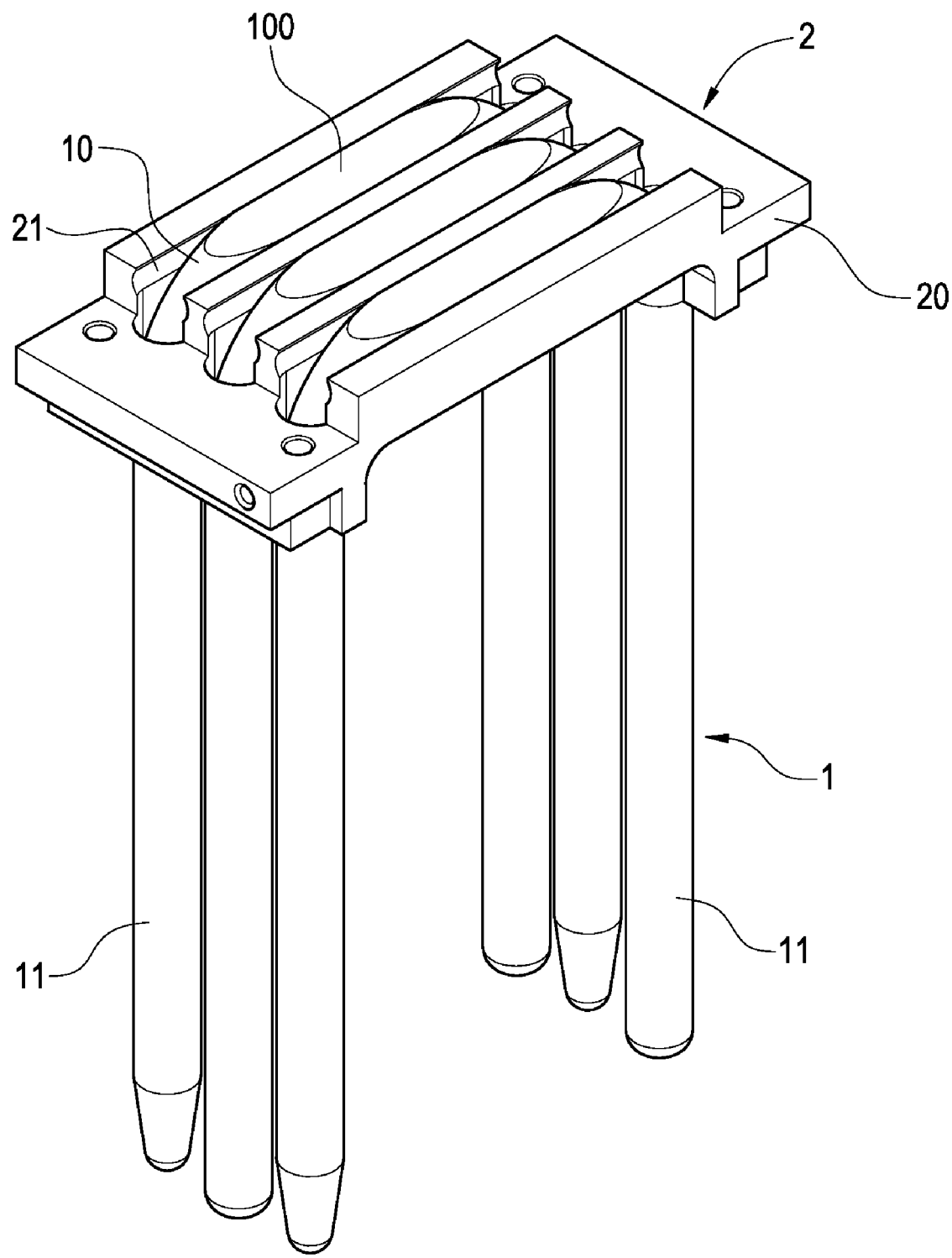
FIG. 11 shows a heat pipe pressed by the method of the invention.

Step S4 of the invention sequentially presses the heat pipe 1 with different stamping dies 410-413 by means of moving the heat pipe 1 onto different working areas 400-403. In other words, the holder 3 holding both the heat pipe 1 and the heat-conducting seat 2 is moved sequentially from the first working area 400 to the fourth working area 403 after one of the stamping dies 410-413 corresponding to heat pipe 1 on the holder 3 has pressed the heat pipe 1 once. For example, the first stamping die 410 presses the heat pipe 1 on the holder 3 mounted on the first working area 400. Then, the holder 3 is moved to the second working area 401 for being pressed by the second stamping die 411. Therefore, the heat pipe 1 being pressed by the stamping dies 410-413 can be progressively transformed to form a flat plane 100 as shown in FIG. 11.

While exemplary embodiment of the foregoing invention has been set forth for purposes of illustration, the foregoing description should not be deemed a limitation of the invention herein. Accordingly, various modifications, adaptations, and alternatives may occur to one skilled in the art without departing from the spirit and the scope of the present invention.

What is claimed is:

1. A method for embedding a heat pipe into a heat-conducting seat, comprising the steps of:

a) preparing a heat pipe having an evaporation section and a condensing section, a solid heat-conducting seat having a slot, and a holder for holding the heat pipe and heat-conducting seat;

b) disposing the evaporation section of the heat pipe in the slot, and the condensing section of the heat pipe passing through the heat-conducting seat so that when the heat-conducting seat is disposed on the holder, the condensing section is accommodated in a through hole of the holder;

c) arranging the heat pipe with the heat-conducting seat on a power press machine by carrying the holder with at least one handle formed thereon, wherein the power press machine comprises:

a bolster bed having a plurality of working areas for the holder being placed thereon; and a ram over the bolster bed, having a plurality of stamping dies corresponding to the working areas, respectively, each of the stamping dies having a pressing surface, wherein the last one of the pressing surfaces is a flat plane, and each of the others has a recess sequentially with different depth from deep to flat; and d) pressing the evaporation section of the heat pipe in the slot sequentially with each of the stamping dies by sequentially moving the holder to one after the other of the working areas.

2. The method of claim 1, wherein each of the working areas has at least one positioning bar corresponding to a groove formed on the holder so that the holder can be precisely positioned on the working area.

3. The method of claim 2, wherein each of the working areas further has a receiving hole for an excessive portion of the condensing section of the heat pipe protruding from the holder to be accommodated therein.

4. The method of claim 1, wherein at least one guiding rod is extended from the ram to correspond to at least one guiding hole formed on the bolster bed for providing a necessary pressing depth of the guiding rod.

* * * * *